(12) United States Patent

Chen et al.

(10) Patent No.: US 9,514,088 B2
(45) Date of Patent: Dec. 6, 2016

(54) METHOD AND DEVICE FOR PROCESSING SERIAL BINARY INPUT BY COMPARING BINARY DIGITS AT EVEN AND ODD LOCATIONS OF THE INPUT

(71) Applicant: Macronix International Co., Ltd., Hsinchu (TW)

(72) Inventors: Ken Hui Chen, Hsinchu (TW); Kuen Long Chang, Taipei (TW); Yu Chen Wang, Kaohsiung (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 14/619,336

(22) Filed: Feb. 11, 2015

(65) Prior Publication Data

US 2016/0085715 A1   Mar. 24, 2016

Related U.S. Application Data

(60) Provisional application No. 62/057,391, filed on Sep. 30, 2014, provisional application No. 62/054,510, filed on Sep. 24, 2014.

(51) Int. Cl.

| H04L 27/10 | (2006.01) |
| G06F 13/42 | (2006.01) |
| G06F 13/16 | (2006.01) |
| H04L 25/49 | (2006.01) |
| G11B 20/14 | (2006.01) |
| H03M 5/12 | (2006.01) |

(52) U.S. Cl.
CPC ....... *G06F 13/4291* (2013.01); *G06F 13/1689*
(2013.01); *G06F 13/4234* (2013.01); *G11B 20/1419* (2013.01); *H03M 5/12* (2013.01); *H04L 25/4904* (2013.01)

(58) Field of Classification Search
CPC .............. G06F 13/4291; G06F 13/1689; G06F 13/4234; H04L 25/4904; H03M 5/12; G11B 20/1419
USPC ........ 375/282; 710/52, 71, 55; 711/170, 154
See application file for complete search history.

(56) References Cited

U.S. PATENT DOCUMENTS

| 5,657,017 A | * | 8/1997 | Snelgrove | ............... H03M 5/12 341/68 |
| 5,805,632 A | * | 9/1998 | Leger | .................. H04L 25/4904 341/55 |
| 5,991,632 A | * | 11/1999 | Guillame | .......... H04W 56/0015 375/355 |
| 6,195,768 B1 | * | 2/2001 | Green | ................... G06F 11/324 398/9 |
| 6,370,212 B1 | * | 4/2002 | Nakai | ..................... H03M 5/12 341/70 |

(Continued)

*Primary Examiner* — Hong Kim
(74) *Attorney, Agent, or Firm* — Finnegan, Henderson, Farabow, Garrett & Dunner LLP

(57) ABSTRACT

A method for command processing in a memory controller includes receiving a serial input signal including a series of binary digits, capturing the binary digits at ones of odd locations or even locations of the serial input signal to form a first sub-series, capturing the binary digits at other ones of the odd locations or the even locations of the serial input signal to form a second sub-series, comparing the first and second sub-series, and performing a command represented by the first sub-series, if the first and second sub-series are complementary to each other.

8 Claims, 5 Drawing Sheets

(56) References Cited

U.S. PATENT DOCUMENTS

2015/0023458 A1* 1/2015 Ngo ................. H04L 25/14
375/361

* cited by examiner

200

US 9,514,088 B2

METHOD AND DEVICE FOR PROCESSING SERIAL BINARY INPUT BY COMPARING BINARY DIGITS AT EVEN AND ODD LOCATIONS OF THE INPUT

CROSS-REFERENCE TO RELATED APPLICATIONS

This application is based upon and claims the benefit of priority from Provisional Application Nos. 62/054,510 filed Sep. 24, 2014, now expired, and 62/057,391 filed Sep. 30, 2014, now expired, the entire contents of both of which are incorporated herein by reference.

TECHNOLOGY FIELD

The disclosure relates to memory control and, more particularly, to a method and device for processing commands for controlling a memory device.

BACKGROUND

A memory device is usually controlled by a memory controller, which, by sending commands to the memory device, can control, for example, the operations of the memory device, such as reading or writing of the memory device. For a memory device, especially a serial peripheral interface (SPI) memory device, a command may be generated as a series of binary digits, i.e., a series of 0's and 1's. For some types of memory devices, the command may be coded using 8 binary digits, which may therefore be referred to as an 8-bit command. For example, a D35H command includes the series of binary digits 00110101, which represents a read command. As a further example, a D75H command includes the series of binary digits 01110101, which represents a write command.

FIG. 1 schematically shows exemplary signal waveforms, including a command as would be applied to a memory controller. In FIG. 1, CSB stands for "Chip Select Bar," which controls when a command is asserted for a certain chip. SIO stands for "Serial Input/Output," which represents the command entered into the memory controller. In the example shown in FIG. 1, the input command is the D35H command which, as described above, includes the series of binary digits 00110101. Further, in FIG. 1, SCLK stands for "Serial Clock."

The memory controller receiving the signal waveforms in FIG. 1 is a single-data-rate controller, which means that the command applied to the memory controller is received and transferred to the memory at rising edges of the clock signal, i.e., SCLK shown in FIG. 1. For example, at the first rising edge of SCLK, SIO is at a low logic voltage level, and thus a low logic voltage level, which represents binary digit "0", is received by the controller and transferred to the memory. Further, for example, at the third rising edge of SCLK, SIO is at a high logic voltage level, and thus a high logic voltage level, which represents binary digit "1", is received by the controller and transferred to the memory. Therefore, if the memory controller operates correctly, the SIO signal is received, i.e., sampled, at a timing corresponding to the clock signal, and transferred to the memory as the correct command, i.e., the D35H command, i.e., a reading command, including a series of binary digits of 00110101.

However, in a high-speed application, each signal needs to switch between high and low logic voltage levels at a high frequency. In such a case, a signal may not switch at the exact timing that it should switch. For example, the SIO signal may not switch at the correct timing, or the SCLK signal may not switch at the correct timing. As a result, the SIO signal may be received, i.e., sampled, at an incorrect time.

For example, due to the high-speed switching, the SIO signal may switch from the low logic voltage level to the high logic voltage level earlier than it is designed to switch, as indicated by the dashed line in FIG. 1. As a result, at the second rising edge of the SCLK signal, when the memory controller samples the logic voltage level of the SIO signal, a high logic voltage level is received and transferred to the memory device, rather than a low logic voltage level as intended. Therefore, instead of receiving the D35H command, which represents a read command, the memory device receives the D75H command including the series of binary digits 01110101, which represents a write command. As a result, the data stored on the memory device are incorrectly erased.

SUMMARY

In accordance with the disclosure, there is provided a method for command processing in a memory controller. The method includes receiving a serial input signal including a series of binary digits, capturing the binary digits at ones of odd locations or even locations of the serial input signal to form a first sub-series, capturing the binary digits at other ones of the odd locations or the even locations of the serial input signal to form a second sub-series, comparing the first and second sub-series, and performing a command represented by the first sub-series, if the first and second sub-series are complementary to each other.

Also in accordance with the disclosure, there is provided a memory controlling device including a processor and a non-transitory computer-readable storage medium storing instructions. The instructions, when executed by the processor, cause the processor to receive a serial input signal including a series of binary digits, capture the binary digits at ones of odd locations or even locations of the serial input signal to form a first sub-series, capture the binary digits at other ones of the odd locations or the even locations of the serial input signal to form a second sub-series, compare the first and second sub-series, and perform a command represented by the first sub-series, if the first and second sub-series are complementary to each other.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include method and device for processing commands for controlling a memory device.

Hereinafter, embodiments consistent with the disclosure will be described with reference to the drawings. Wherever possible, the same reference numbers will be used throughout the drawings to refer to the same or like parts.

Figure 1:
FIG. 1 schematically shows signal waveforms received by a memory controller according to a conventional technology.
Figure 2:
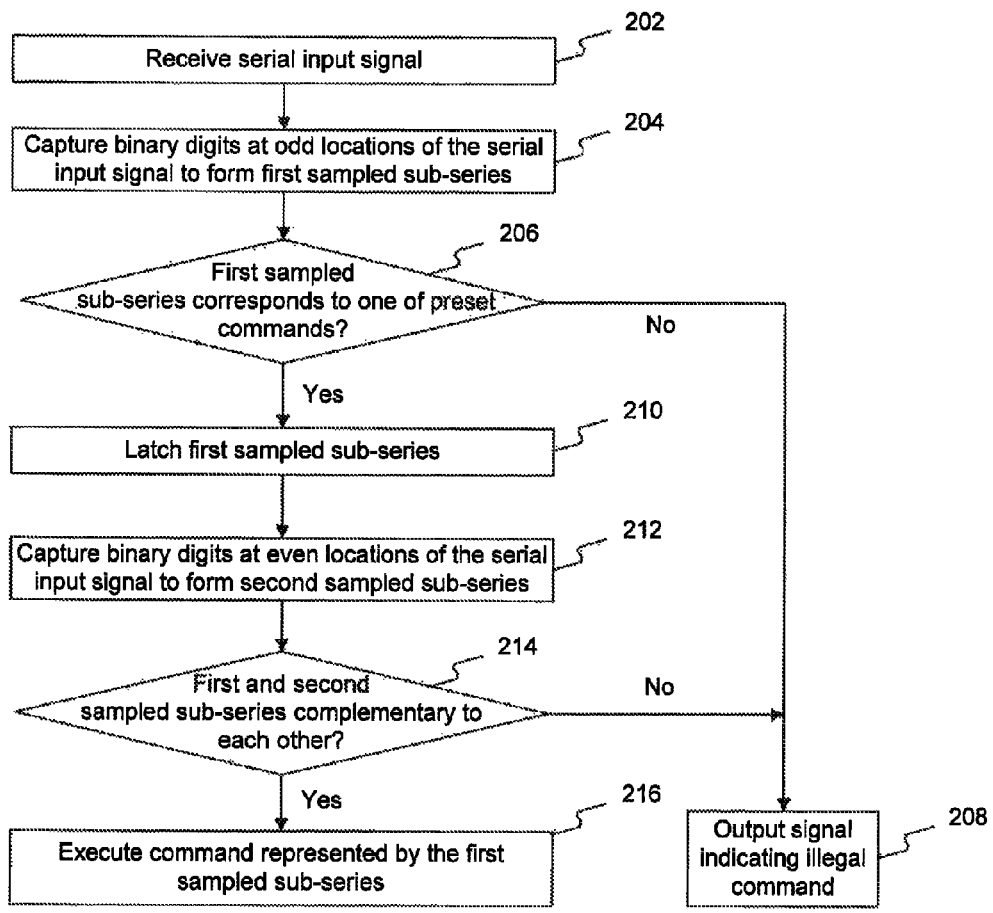
FIG. 2 is a flow chart showing a method according to an exemplary embodiment.

FIG. 2 is a flow chart showing an exemplary method 200 for processing commands for controlling a memory device consistent with embodiments of the disclosure. The method can be executed in a memory controller consistent with embodiments of the disclosure.

As shown in FIG. 2, at 202, the memory controller receives a serial input signal including a series of binary digits. The serial input signal is programmed so that binary digits at odd locations of the serial input signal, i.e., the odd locations of the series of binary digits, are complementary to binary digits at even locations of the series. Hereinafter, the series formed by the binary digits at the odd locations of the serial input signal is referred to as a first input sub-series and represents a command to be output to and executed by the memory device. Correspondingly, the series formed by the binary digits at the even locations of the serial input signal is referred to as a second input sub-series and represents a complement of the command, which is also referred to as a command bar in this disclosure.

In the present disclosure, a description with respect to "odd locations" is interchangeable with a corresponding description with respect to "even locations." For example, as indicated in the paragraph immediately above, the binary digits at the odd locations represent a command and the binary digits at the even locations represent a command bar. In another embodiment (the description of which is omitted here), the binary digits at the odd locations can represent the command bar and the binary digits at the even locations can represent the command.

At 204, the memory controller captures (or samples) the binary digits at the odd locations of the serial input signal. This process is also referred to herein as decoding of the command. The result of the capturing (or sampling) is a series of binary digits, which is also referred to herein as a first sampled sub-series.

At 206, the first sampled sub-series is checked against a command list including a plurality of preset commands, to determine whether the first sampled sub-series corresponds to one of the preset commands. If the first sampled sub-series does not correspond to any of the preset commands (206: No), the memory controller outputs a signal indicating that the first sampled sub-series represents an illegal command (208 in FIG. 2). On the other hand, if the first sampled sub-series corresponds to one of the preset commands (206: Yes), the first sampled sub-series is latched (210 in FIG. 2).

At 212, the memory controller captures (or samples) the binary digits at the even locations of the serial input signal. This process is also referred to herein as decoding of the command bar. The result of the capturing (or sampling) is a series of binary digits, which is also referred to herein as a second sampled sub-series.

At 214, the memory controller compares the first sampled sub-series with the second sampled sub-series, to determine whether they are complementary to each other. If not (214: No), the memory controller outputs the signal indicating that the first sampled sub-series represents an illegal command (208 in FIG. 2). On the other hand, if the first and second sampled sub-series are complementary to each other, then the first sampled sub-series represents a legal command, and the command is executed (216 in FIG. 2).

The process shown in FIG. 2 is an example. A method consistent with embodiments of the disclosure does not have to include the entire process shown in FIG. 2. For example, the first and second sampled sub-series can be compared directly, without first checking the first sampled sub-series against the command list.

Consistent with embodiments of the disclosure, the series of binary digits in the serial input signal are represented by a series of high or low logic voltage levels of the serial input signal. In some embodiments, the high logic voltage level represents a binary digit "1" while the low logic voltage level represents a binary digit "0". The timing to capture (or sample) binary digits may be controlled by a serial clock signal. In some embodiments binary digits are captured at same edges, such as rising edges, of the serial clock signal. Such a mode is referred to as a single-data-rate mode, in which one binary digit is captured and output per clock cycle. In some embodiments binary digits are captured at both rising and falling edges of the serial clock signal. Such a mode is referred to as a double-data-rate mode, in which two binary digits are captured and output per clock cycle.

Figure 3A:
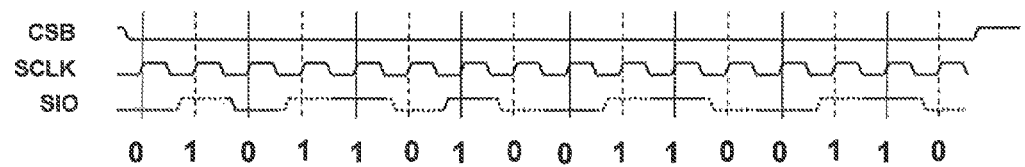
FIGS. 3A and 3B schematically show signal waveforms received by a memory controller according to exemplary embodiments.
Figure 3B:
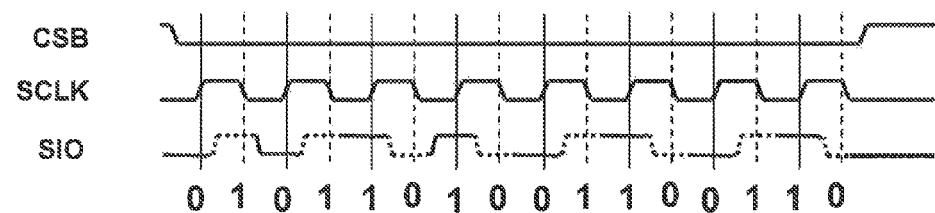

FIGS. 3A and 3B schematically show exemplary signal waveforms in the single-data-rate mode and double-data-rate mode, respectively. In FIGS. 3A and 3B, CSB, SCLK, and SIO refer to "Command Select Bar," "Serial Clock," and "Serial Input/Output," respectively, as described above. As shown in FIGS. 3A and 3B, the command to be output to and executed by the memory device is a D35H command, represented by a first input sub-series of binary digits 00110101. When programming the SIO signal, a user intersperses a complementary command, i.e., command bar, represented by a second input sub-series of binary digits 11001010 (depicted in FIGS. 3A and 3B by dotted curve segments), in the first input sub-series (depicted in FIGS. 3A and 3B by solid curve segments). As a result, the SIO signal received by the memory controller becomes 0101101001100110.

In the single-data-rate mode shown in FIG. 3A, after the memory controller receives the SIO signal, the command is decoded by sampling the SIO signal, i.e., measuring logic voltage levels of the SIO signal, at odd rising edges of the SCLK signal (indicated by solid vertical lines in the figure), and the command bar is decoded by sampling the SIO signal, i.e., measuring logic voltage levels of the SIO signal, at even rising edges of the SCLK signal (indicated by dashed vertical lines in the figure). The sampling results are further processed according to methods consistent with embodiments of the disclosure, such as the exemplary method shown in FIG. 2.

In the double-data-rate mode shown in FIG. 3B, after the memory controller receives the SIO signal, the command is decoded by sampling the SIO signal, i.e., measuring logic voltage levels of the SIO signal, at rising edges of the SCLK signal (indicated by solid vertical lines in the figure), and the command bar is decoded by sampling the SIO signal, i.e., measuring logic voltage levels of the SIO signal, at falling edges of the SCLK signal (indicated by dashed vertical lines in the figure). The sampling results are further processed according to methods consistent with embodiments of the disclosure, such as the exemplary method shown in FIG. 2.

Figure 4A:
FIGS. 4A and 4B schematically show signal waveforms received by a memory controller according to other exemplary embodiments.
Figure 4B:

FIGS. 3A and 3B show a scenario in which the memory controller has a single input/output port. Methods consistent with embodiments of the disclosure can also be applied to a memory controller having multiple input/output ports. For example, FIGS. 4A and 4B show a scenario in which the memory controller has two input/output ports, where FIG. 4A corresponds to a single-data-rate mode and FIG. 4B corresponds to a double-data-rate mode. As shown in FIGS. 4A and 4B, the command is broken up and transferred by two signals SIO0 and SIO1, where SIO0 carries odd digits of the command, i.e., 0100, and SIO1 carries even digits of the command, i.e., 0111. Similarly, the command bar is broken up and transferred by the two signals SIO0 and SIO1, where SIO0 carries odd digits of the command bar, i.e., 1011, and SIO1 carries even digits of the command bar, i.e., 1000.

As shown in FIG. 4A, i.e., the single-data-rate mode, after the memory controller receives the SIO0 and SIO1 signals, the command is decoded by sampling the SIO0 and SIO1 signals, i.e., measuring logic voltage levels of the SIO0 and SIO1 signals, at odd rising edges of the SCLK signal, and the command bar is decoded by sampling the SIO0 and SIO1 signals, i.e., measuring logic voltage levels of the SIO0 and SIO1 signals, at even rising edges of the SCLK signal. The sampling results are further processed according to methods consistent with embodiments of the disclosure, such as the exemplary method shown in FIG. 2.

As shown in FIG. 4B, i.e., the double-data-rate mode, after the memory controller receives the SIO0 and SIO1 signals, the command is decoded by sampling the SIO0 and SIO1 signals, i.e., measuring logic voltage levels of the SIO0 and SIO1 signals, at rising edges of the SCLK signal, and the command bar is decoded by sampling the SIO0 and SIO1 signals, i.e., measuring logic voltage levels of the SIO0 and SIO1 signals, at falling edges of the SCLK signal. The sampling results are further processed according to methods consistent with embodiments of the disclosure, such as the exemplary method shown in FIG. 2.

Figure 5A:
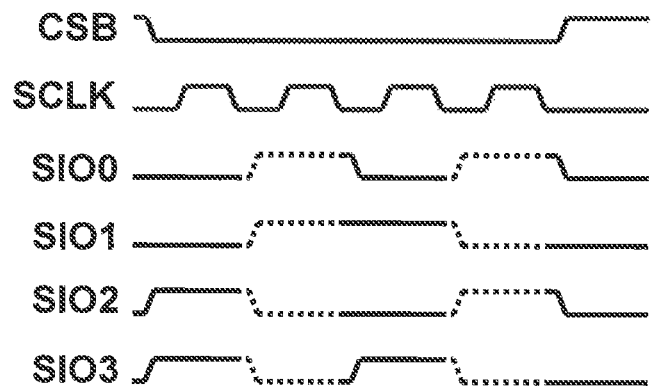
FIGS. 5A and 5B schematically show signal waveforms received by a memory controller according to other exemplary embodiments.
Figure 5B:
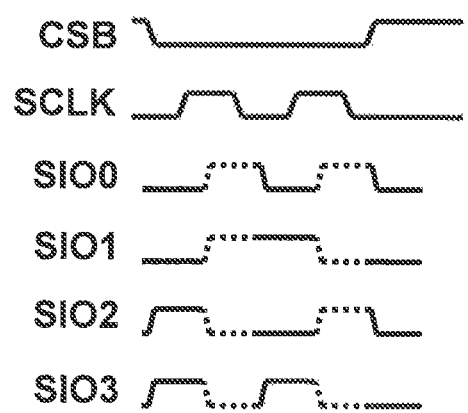

As another example, FIGS. 5A and 5B show a scenario in which the memory controller has four input/output ports, where FIG. 5A corresponds to a single-data-rate mode and FIG. 5B corresponds to a double-data-rate mode. As shown in FIGS. 5A and 5B, the command is broken up and transferred by four signals SIO0, SIO1, SIO2, and SIO3, where SIO0 carries the first digit of every four digits of the command, i.e., 00, SIO1 carries the second digit of every four digits of the command, i.e., 01, SIO2 carries the third digit of every four digits of the command, i.e., 10, and SIO3 carries the fourth digit of every four digits of the command, i.e., 11. Similarly, the command bar is broken up and transferred by the four signals SIO0, SIO1, SIO2, and SIO3, where SIO0 carries the first digit of every four digits of the command bar, i.e., 11, SIO1 carries the second digit of every four digits of the command bar, i.e., 10, SIO2 carries the third digit of every four digits of the command bar, i.e., 01, and SIO3 carries the fourth digit of every four digits of the command bar, i.e., 00.

As shown in FIG. 5A, i.e., the single-data-rate mode, after the memory controller receives the SIO0, SIO1, SIO2, and SIO3 signals, the command is decoded by sampling the SIO0, SIO1, SIO2, and SIO3 signals, i.e., measuring logic voltage levels of the SIO0, SIO1, SIO2, and SIO3 signals, at odd rising edges of the SCLK signal, and the command bar is decoded by sampling the SIO0, SIO1, SIO2, and SIO3 signals, i.e., measuring logic voltage levels of the SIO0, SIO1, SIO2, and SIO3 signals, at even rising edges of the SCLK signal. The sampling results are further processed according to methods consistent with embodiments of the disclosure, such as the exemplary method shown in FIG. 2.

As shown in FIG. 5B, i.e., the double-data-rate mode, after the memory controller receives the SIO0, SIO1, SIO2, and SIO3 signals, the command is decoded by sampling the SIO0, SIO1, SIO2, and SIO3 signals, i.e., measuring logic voltage levels of the SIO0, SIO1, SIO2, and SIO3 signals, at rising edges of the SCLK signal, and the command bar is decoded by sampling the SIO0, SIO1, SIO2, and SIO3 signals, i.e., measuring logic voltage levels of the SIO0, SIO1, SIO2, and SIO3 signals, at falling edges of the SCLK signal. The sampling results are further processed according to methods consistent with embodiments of the disclosure, such as the exemplary method shown in FIG. 2.

Figure 6A:
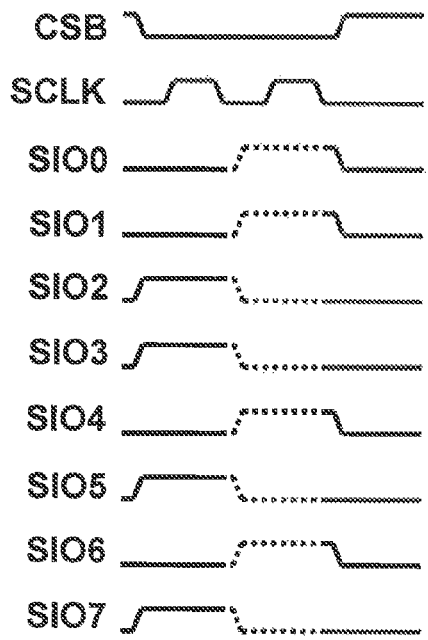
FIGS. 6A and 6B schematically show signal waveforms received by a memory controller according to other exemplary embodiments.
Figure 6B:
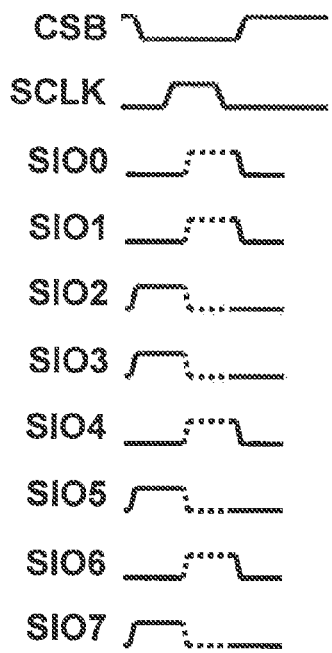

FIGS. 6A and 6B show another example in which the memory controller has eight input/output ports, where FIG. 6A corresponds to a single-data-rate mode and FIG. 6B corresponds to a double-data-rate mode. This example is similar to those shown in FIGS. 3A-5B, except that the command and the command bar are broken up and carried by eight signals SIO0, SIO1, SIO2, SIO3, SIO4, SIO5, SIO6, and SIO7, The encoding and decoding of the command and the command bar, and the processing of the sampling results are similar to those described above with respect to the scenarios of one, two, and four input/output ports, and thus are not repeated.

Figure 7:
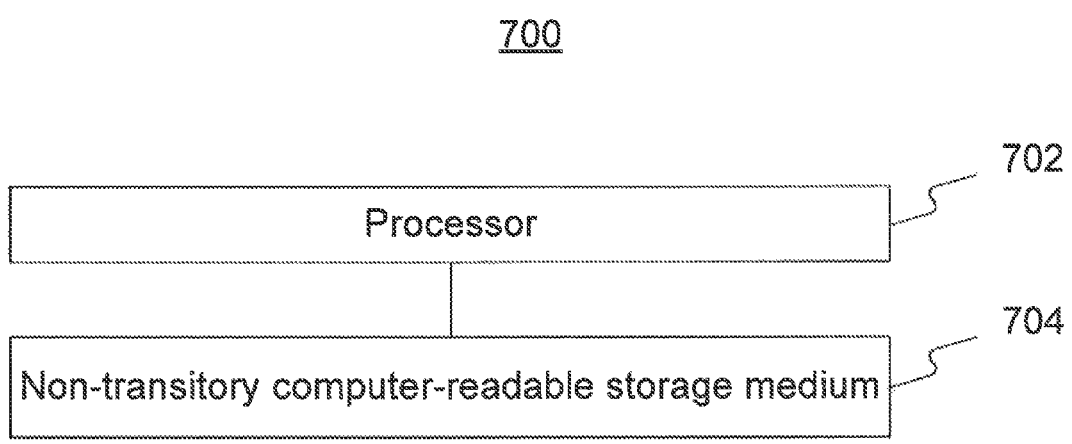
FIG. 7 schematically shows a memory controlling device according to an exemplary embodiment.

FIG. 7 shows a memory controlling device 700 consistent with embodiments of the disclosure. As shown in FIG. 7, the memory controlling device 700 includes a processor 702 and a non-transitory computer-readable storage medium 704. The storage medium 704 stores instructions that, when executed by the processor 702, cause the processor 702, and thus the memory controlling device 700, to execute a method consistent with embodiments of the disclosure, such as those described above.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for command processing in a memory controller, comprising:
   receiving, by the memory controller, a serial input signal including a series of binary digits;
   capturing, by the memory controller, the binary digits at ones of odd locations or even locations of the serial input signal to form a first sub-series;
   checking, by the memory controller, the first sub-series against a plurality of preset commands;
   capturing, by the memory controller after checking the first sub-series against the preset commands and if the first sub-series corresponds to one of the preset commands, the binary digits at other ones of the odd locations or the even locations of the serial input signal to form a second sub-series;

comparing, by the memory controller, the first and second sub-series; and performing, by the memory controller, the one of the preset commands represented by the first sub-series, if the first and second sub-series are complementary to each other.

2. The method according to claim 1, wherein:
capturing the binary digits at the ones of the odd locations or the even locations of the serial input signal to form the first sub-series includes capturing the binary digits at the odd locations of the serial input signal to form the first sub-series, and capturing the binary digits at the other ones of the odd locations or the even locations of the serial input signal to form the second sub-series includes capturing the binary digits at the even locations of the serial input signal to form the second sub-series.

3. The method according to claim 1, further comprising:
outputting a signal indicating no legal command is received, if the first and second sub-series are not complementary to each other.

4. The method according to claim 1, further comprising:
outputting a signal indicating no legal command is received, if the first sub-series does not correspond to any one of the preset commands.

5. The method according to claim 1, further comprising:
latching the first sub-series before capturing the binary digits at the other ones of the odd locations or the even locations of the serial input signal.

6. The method according to claim 1, further comprising:
receiving a serial clock signal,
wherein:
the series of binary digits are represented by a series of high or low logic voltage levels of the serial input signal, capturing the binary digits at the odd locations of the serial input signal includes measuring logic voltage levels of the serial input signal at odd rising edges of the serial clock signal, and capturing the binary digits at the even locations of the serial input signal includes measuring logic voltage levels of the serial input signal at even rising edges of the serial clock signal.

7. The method according to claim 1, further comprising:
receiving a serial clock signal,
wherein:
the series of binary digits are represented by a series of high or low logic voltage levels of the serial input signal, capturing the binary digits at the odd locations of the serial input signal includes measuring logic voltage levels of the serial input signal at rising edges of the serial clock signal, and capturing the binary digits at the even locations of the serial input signal includes measuring logic voltage levels of the serial input signal at falling edges of the serial clock signal.

8. A memory controlling device comprising:
a processor;
a non-transitory computer-readable storage medium storing instructions that, when executed by the processor, cause the processor to:
receive a serial input signal including a series of binary digits;

capture the binary digits at ones of odd locations or even locations of the serial input signal to form a first sub-series;

check the first sub-series against a plurality of preset commands;

capture, after checking the first sub-series against the preset commands and if the first sub-series corresponds to one of the preset commands, the binary digits at other ones of the odd locations or the even locations of the serial input signal to form a second sub-series;

compare the first and second sub-series; and perform the one of the preset commands represented by the first sub-series, if the first and second sub-series are complementary to each other.

* * * * *